United States Patent
Tuers et al.

(10) Patent No.: US 9,230,689 B2
(45) Date of Patent: Jan. 5, 2016

(54) FINDING READ DISTURBS ON NON-VOLATILE MEMORIES

(71) Applicant: SanDisk Technologies Inc., Plano, TX (US)

(72) Inventors: Daniel Tuers, Kapaa, HI (US); Yosief Ataklti, Fremont, CA (US); Abhijeet Manohar, Karnataka (IN)

(73) Assignee: SanDisk Technologies Inc., Plano, TX (US)

( * ) Notice: Subject to any disclaimer, the term of this patent is extended or adjusted under 35 U.S.C. 154(b) by 102 days.

(21) Appl. No.: 14/215,924

(22) Filed: Mar. 17, 2014

(65) Prior Publication Data

US 2015/0262714 A1    Sep. 17, 2015

(51) Int. Cl.
| | |
|---|---|
| *G11C 8/00* | (2006.01) |
| *G11C 29/50* | (2006.01) |
| *G06F 11/10* | (2006.01) |
| *G11C 16/10* | (2006.01) |
| *G11C 11/56* | (2006.01) |
| *G11C 16/32* | (2006.01) |

(52) U.S. Cl.
CPC ...... *G11C 29/50004* (2013.01); *G06F 11/1072* (2013.01); *G11C 16/102* (2013.01); *G11C 11/5642* (2013.01); *G11C 16/32* (2013.01); *G11C 2029/5004* (2013.01)

(58) Field of Classification Search
CPC ............... G11C 11/5642; G11C 16/32; G11C 11/4076; G11C 11/4085; Y02B 60/1225
USPC ............. 365/230.01, 185.11, 185.12, 185.13, 365/189.011, 189.15, 230.03, 239
See application file for complete search history.

(56) References Cited

U.S. PATENT DOCUMENTS

| | | | |
|---|---|---|---|
| 4,139,911 A | 2/1979 | Sciulli et al. | |
| 4,218,764 A | 8/1980 | Furuta et al. | |
| 4,253,059 A | 2/1981 | Bell et al. | |
| 4,460,982 A | 7/1984 | Gee et al. | |

(Continued)

FOREIGN PATENT DOCUMENTS

| | | |
|---|---|---|
| EP | 97460009.0 | 2/1997 |
| EP | 0791933 | 8/1997 |

(Continued)

OTHER PUBLICATIONS

International Search Report and Written Opinion of the International Searching Authority issued in International Application No. PCT/US2014/018527, mailed on May 22, 2015, 12 pages.

(Continued)

*Primary Examiner* — Fernando Hidalgo
(74) *Attorney, Agent, or Firm* — Davis Wright Tremaine LLP

(57) ABSTRACT

In non-volatile memory devices, the accessing of data on word line can degrade the data quality on a neighboring word line, in what is called a read disturb. Techniques are presented for determining word lines likely to suffer read disturbs by use of a hash tree for tracking the number of reads. Read counters are maintained for memory units at a relatively coarse granularity, such as a die or block. When the counter for one of these units reaches a certain level, it is subdivided into sub-units, each with their own read counter, in a process that be repeated to determine frequently read word lines with a fine level of granularity while only using a relatively modest amount of RAM on the controller to store the counters.

29 Claims, 15 Drawing Sheets

(56) References Cited

U.S. PATENT DOCUMENTS

| | | |
|---|---|---|
| 4,612,630 A | 9/1986 | Rosier |
| 4,694,454 A | 9/1987 | Matsuura |
| 4,703,196 A | 10/1987 | Arakawa |
| 4,703,453 A | 10/1987 | Shinoda et al. |
| 4,733,394 A | 3/1988 | Giebel |
| 4,763,305 A | 8/1988 | Kuo |
| 4,779,272 A | 10/1988 | Kohda et al. |
| 4,799,195 A | 1/1989 | Iwahashi et al. |
| 4,809,231 A | 2/1989 | Shannon et al. |
| 4,827,450 A | 5/1989 | Kowalski |
| 4,937,787 A | 6/1990 | Kobatake |
| 4,962,322 A | 10/1990 | Chapman |
| 4,964,079 A | 10/1990 | Devin |
| 4,975,883 A | 12/1990 | Baker et al. |
| 4,980,859 A | 12/1990 | Guterman et al. |
| 5,043,940 A | 8/1991 | Harari |
| 5,052,002 A | 9/1991 | Tanagawa |
| 5,065,364 A | 11/1991 | Atwood et al. |
| 5,070,032 A | 12/1991 | Yuan et al. |
| 5,095,344 A | 3/1992 | Harari |
| 5,119,330 A | 6/1992 | Tanagawa |
| 5,122,985 A | 6/1992 | Santin |
| 5,132,928 A | 7/1992 | Hayashikoshi et al. |
| 5,132,935 A | 7/1992 | Ashmore, Jr. |
| 5,151,906 A | 9/1992 | Sawada |
| 5,157,629 A | 10/1992 | Sato et al. |
| 5,172,338 A | 12/1992 | Mehrotra et al. |
| 5,172,339 A | 12/1992 | Noguchi et al. |
| 5,200,922 A | 4/1993 | Rao |
| 5,200,959 A | 4/1993 | Gross et al. |
| 5,239,505 A | 8/1993 | Fazio et al. |
| 5,262,984 A | 11/1993 | Noguchi et al. |
| 5,263,032 A | 11/1993 | Porter et al. |
| 5,270,551 A | 12/1993 | Kamimura et al. |
| 5,270,979 A | 12/1993 | Harari et al. |
| 5,278,794 A | 1/1994 | Tanaka et al. |
| 5,313,421 A | 5/1994 | Guterman et al. |
| 5,313,427 A | 5/1994 | Schreck et al. |
| 5,315,541 A | 5/1994 | Harari et al. |
| 5,321,655 A | 6/1994 | Iwahashi et al. |
| 5,327,383 A | 7/1994 | Merchant et al. |
| 5,335,198 A | 8/1994 | Van Buskirk et al. |
| 5,341,334 A | 8/1994 | Maruyama |
| 5,343,063 A | 8/1994 | Yuan et al. |
| 5,347,489 A | 9/1994 | Merchant et al. |
| 5,365,486 A | 11/1994 | Schreck |
| 5,377,147 A | 12/1994 | Merchant et al. |
| 5,394,359 A | 2/1995 | Kowalski |
| 5,404,485 A | 4/1995 | Ban |
| 5,450,363 A | 9/1995 | Christopherson et al. |
| 5,465,236 A | 11/1995 | Naruke |
| 5,475,693 A | 12/1995 | Christopherson et al. |
| 5,504,760 A | 4/1996 | Harari et al. |
| 5,523,972 A | 6/1996 | Rashid et al. |
| 5,530,705 A | 6/1996 | Malone, Sr. |
| 5,532,962 A | 7/1996 | Auclair et al. |
| 5,570,315 A | 10/1996 | Tanaka et al. |
| 5,583,812 A | 12/1996 | Harari |
| 5,621,682 A | 4/1997 | Tanzawa et al. |
| 5,648,934 A | 7/1997 | O'Toole |
| 5,652,720 A | 7/1997 | Aulas et al. |
| 5,657,332 A | 8/1997 | Auclair et al. |
| 5,661,053 A | 8/1997 | Yuan |
| 5,675,537 A | 10/1997 | Bill et al. |
| 5,689,465 A | 11/1997 | Sukegawa et al. |
| 5,699,297 A | 12/1997 | Yamazaki et al. |
| 5,703,506 A | 12/1997 | Shook et al. |
| 5,712,815 A | 1/1998 | Bill et al. |
| 5,715,193 A | 2/1998 | Norman |
| 5,717,632 A | 2/1998 | Richart et al. |
| 5,751,639 A | 5/1998 | Ohsawa |
| 5,761,125 A | 6/1998 | Himeno |
| 5,768,192 A | 6/1998 | Eitan |
| 5,774,397 A | 6/1998 | Endoh et al. |
| 5,798,968 A | 8/1998 | Lee et al. |
| 5,835,413 A | 11/1998 | Hurter et al. |
| 5,889,698 A | 3/1999 | Miwa et al. |
| 5,890,192 A | 3/1999 | Lee et al. |
| 5,903,495 A | 5/1999 | Takeuchi et al. |
| 5,905,673 A | 5/1999 | Khan |
| 5,909,449 A | 6/1999 | So et al. |
| 5,930,167 A | 7/1999 | Lee et al. |
| 5,937,425 A | 8/1999 | Ban |
| 5,963,473 A | 10/1999 | Norman |
| 6,011,725 A | 1/2000 | Eitan |
| 6,046,935 A | 4/2000 | Takeuchi et al. |
| 6,145,051 A | 11/2000 | Estakhri et al. |
| 6,151,246 A | 11/2000 | So et al. |
| 6,199,139 B1 | 3/2001 | Katayama et al. |
| 6,215,697 B1 | 4/2001 | Lu et al. |
| 6,222,762 B1 | 4/2001 | Guterman et al. |
| 6,222,768 B1 | 4/2001 | Hollmer et al. |
| 6,345,001 B1 | 2/2002 | Mokhlesi |
| 6,415,352 B1 | 7/2002 | Asami et al. |
| 6,426,893 B1 | 7/2002 | Conley et al. |
| 6,456,528 B1 | 9/2002 | Chen |
| 6,522,580 B2 | 2/2003 | Chen et al. |
| 6,567,307 B1 | 5/2003 | Estakhri |
| 6,678,785 B2 | 1/2004 | Lasser |
| 6,728,134 B2 | 4/2004 | Ooishi |
| 6,760,255 B2 | 7/2004 | Conley et al. |
| 6,763,424 B2 | 7/2004 | Conley |
| 6,772,274 B1 | 8/2004 | Estakhri |
| 6,807,101 B2 | 10/2004 | Ooishi et al. |
| 6,839,281 B2 | 1/2005 | Chen et al. |
| 6,912,160 B2 | 6/2005 | Yamada |
| 6,925,007 B2 | 8/2005 | Harari et al. |
| 6,963,505 B2 | 11/2005 | Cohen |
| 7,012,835 B2 | 3/2006 | Gonzalez et al. |
| 7,076,598 B2 | 7/2006 | Wang |
| 7,224,607 B2 | 5/2007 | Gonzalez et al. |
| 7,224,611 B2 | 5/2007 | Yamamoto et al. |
| 7,242,618 B2 | 7/2007 | Shappir et al. |
| 7,254,071 B2 | 8/2007 | Tu et al. |
| 7,257,025 B2 | 8/2007 | Maayan et al. |
| 7,286,412 B1 | 10/2007 | Chen |
| 7,330,376 B1 | 2/2008 | Chen et al. |
| 7,450,425 B2 | 11/2008 | Aritome |
| 7,489,549 B2 | 2/2009 | Mokhlesi |
| 7,518,919 B2 | 4/2009 | Gonzalez et al. |
| 7,613,043 B2 | 11/2009 | Cornwell et al. |
| 7,630,254 B2 | 12/2009 | Lutze |
| 7,631,245 B2 | 12/2009 | Lasser |
| 7,716,538 B2 | 5/2010 | Gonzalez et al. |
| 7,818,525 B1 | 10/2010 | Frost et al. |
| 7,835,209 B2 | 11/2010 | Park et al. |
| 7,839,685 B2 | 11/2010 | Auclair et al. |
| 2002/0048202 A1 | 4/2002 | Higuchi |
| 2003/0086293 A1 | 5/2003 | Gongwer et al. |
| 2003/0109093 A1 | 6/2003 | Harari et al. |
| 2005/0073884 A1 | 4/2005 | Gonzalez et al. |
| 2005/0122779 A1 | 6/2005 | Fasoli et al. |
| 2005/0231999 A1 | 10/2005 | Moriyama |
| 2006/0039196 A1 | 2/2006 | Gorobets et al. |
| 2006/0062048 A1 | 3/2006 | Gonzalez et al. |
| 2006/0233023 A1 | 10/2006 | Lin et al. |
| 2007/0174740 A1 | 7/2007 | Kanno |
| 2007/0211532 A1 | 9/2007 | Gonzalez et al. |
| 2007/0263439 A1 | 11/2007 | Cornwell et al. |
| 2007/0279989 A1 | 12/2007 | Aritome |
| 2008/0071511 A1 | 3/2008 | Lin |
| 2008/0123420 A1 | 5/2008 | Brandman et al. |
| 2008/0158968 A1 | 7/2008 | Moogat et al. |
| 2008/0158969 A1 | 7/2008 | Moogat et al. |
| 2009/0003058 A1 | 1/2009 | Kang |
| 2009/0034328 A1 | 2/2009 | Seol |
| 2009/0168533 A1 | 7/2009 | Park et al. |
| 2009/0187785 A1 | 7/2009 | Gonzalez et al. |
| 2009/0204824 A1 | 8/2009 | Lin et al. |
| 2009/0268524 A1 | 10/2009 | Maejima |
| 2010/0322000 A1 | 12/2010 | Shim et al. |
| 2012/0051137 A1 | 3/2012 | Hung et al. |
| 2013/0028021 A1 | 1/2013 | Sharon et al. |
| 2013/0128666 A1 | 5/2013 | Avila et al. |

(56) References Cited

U.S. PATENT DOCUMENTS

| | | | | |
|---|---|---|---|---|
| 2014/0223246 A1* | 8/2014 | Kim | .................. | G11C 16/3427 714/718 |
| 2014/0237319 A1* | 8/2014 | Seo | .................... | G06F 11/1048 714/764 |
| 2014/0355332 A1* | 12/2014 | Youn | ................ | G11C 11/40615 365/149 |

FOREIGN PATENT DOCUMENTS

| | | |
|---|---|---|
| GB | 2289779 | 11/1995 |
| JP | 8-077785 | 3/1996 |
| JP | 8-147988 | 6/1996 |
| JP | 8-279295 | 10/1996 |
| JP | 8-297987 | 11/1996 |
| JP | 09-128165 | 5/1997 |
| JP | 9-306182 | 11/1997 |
| JP | 2000-187992 | 7/2000 |
| JP | 2002-318729 | 10/2002 |
| JP | 2003-058432 | 2/2003 |
| WO | WO 9012400 | 10/1999 |
| WO | WO 01/08015 | 2/2001 |
| WO | WO 01/22232 | 3/2001 |
| WO | WO 02/058074 | 7/2002 |
| WO | WO 2005/036401 | 4/2005 |
| WO | WO 2005/041107 | 5/2005 |
| WO | WO 2011/019602 | 2/2011 |
| WO | WO 2011/024015 | 3/2011 |

OTHER PUBLICATIONS

Lee et al., "Error Correction Technique for Multivalued MOS Memory," *Electronic Letters*, vol. 27, No. 15, Jul. 18, 1991, pp. 1321-1323.

Technical Search Report, Dec. 18, 2012, 8 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

\* cited by examiner

Programming into Four States Represented by a 2-bit Code

FINDING READ DISTURBS ON NON-VOLATILE MEMORIES

BACKGROUND

The following relates to the operation of re-programmable non-volatile memory systems such as semiconductor flash memory, and, more specifically, to the determination and management of error on such memories.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, whether embedded, a solid state drive (SSD) and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card or in a solid state drive (SSD). Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. No. 5,768,192 and U.S. Pat. No. 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

In flash memory systems, erase operation may take as much as an order of magnitude longer than read and program operations. Thus, it is desirable to have the erase block of substantial size. In this way, the erase time is amortized over a large aggregate of memory cells.

The nature of flash memory predicates that data must be written to an erased memory location. If data of a certain logical address from a host is to be updated, one way is rewrite the update data in the same physical memory location. That is, the logical to physical address mapping is unchanged. However, this will mean the entire erase block contain that physical location will have to be first erased and then rewritten with the updated data. This method of update is inefficient, as it requires an entire erase block to be erased and rewritten, especially if the data to be updated only occupies a small portion of the erase block. It will also result in a higher frequency of erase recycling of the memory block, which is undesirable in view of the limited endurance of this type of memory device.

Data communicated through external interfaces of host systems, memory systems and other electronic systems are addressed and mapped into the physical locations of a flash memory system. Typically, addresses of data files generated or received by the system are mapped into distinct ranges of a continuous logical address space established for the system in terms of logical blocks of data (hereinafter the "LBA interface"). The extent of the address space is typically sufficient to cover the full range of addresses that the system is capable of handling. In one example, magnetic disk storage drives communicate with computers or other host systems through such a logical address space. This address space has an extent sufficient to address the entire data storage capacity of the disk drive.

Flash memory systems are most commonly provided in the form of a memory card or flash drive that is removably connected with a variety of hosts such as a personal computer, a camera or the like, but may also be embedded within such host systems or be in the form of a solid state drive. When writing data to the memory, the host typically assigns unique logical addresses to sectors, clusters or other units of data within a continuous virtual address space of the memory system. Like a disk operating system (DOS), the host writes data to, and reads data from, addresses within the logical address space of the memory system. A controller within the memory system translates logical addresses received from the host into physical addresses within the memory array, where the data are actually stored, and then keeps track of these address translations. The data storage capacity of the memory system is at least as large as the amount of data that is addressable over the entire logical address space defined for the memory system.

In current commercial flash memory systems, the size of the erase unit has been increased to a block of enough memory cells to store multiple sectors of data. Indeed, many pages of data are stored in one block, and a page may store multiple sectors of data. Further, two or more blocks are often operated together as metablocks, and the pages of such blocks logically linked together as metapages. A page or metapage of data are written and read together, which can include many sectors of data, thus increasing the parallelism of the operation. Along with such large capacity operating units the challenge is to operate them efficiently.

For ease of explanation, unless otherwise specified, it is intended that the term "block" as used herein refer to either the block unit of erase or a multiple block "metablock," depending upon whether metablocks are being used in a specific system. Similarly, reference to a "page" herein may refer to a unit of programming within a single block or a "metapage" within a metablock, depending upon the system configuration.

In charge storing non-volatile memory devices, such as those based on EEPROM or dielectric storage, the non-volatility is non-perfect and the data value stored in an element can be degraded by leakage over time. Operations in one part of the memory circuit can also affect data values in storage elements not being directly acted upon. For example, capacitive coupling between memory cells on adjacent word lines can lead "read disturbs" or "write disturbs" when a neighboring word line is read or written. (Erase disturbs may also occur, depending on the granularity at which cells are erased.) To maintain the integrity of data in such memory systems, the effects of such disturbs need to be considered.

SUMMARY OF THE INVENTION

According to a general aspect of the invention, a method is presented for the operating of a non-volatile memory system having one or more memory circuits and a controller circuit. The memory circuits each include one or more arrays of non-volatile memory cells formed along word lines and the controller circuit manages the storage of data on the memory circuit. For each of a first plurality of distinct divisions of the one or more memory arrays the controller circuit maintains a count of the number of times word lines of the corresponding division is accessed for a read operation. In response to one of the counts for a corresponding division reaching a first threshold value, subdividing the corresponding division is subdivide into a second plurality of distinct first subdivisions. For each of the first subdivisions the controller circuit subsequently maintains a count of the number of times word lines of the subdivision is accessed for read operations.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

FIG. 1 to FIG. 10B provide example memory systems in which the various aspects of the present invention may be implemented or illustrated.

Figure 1:
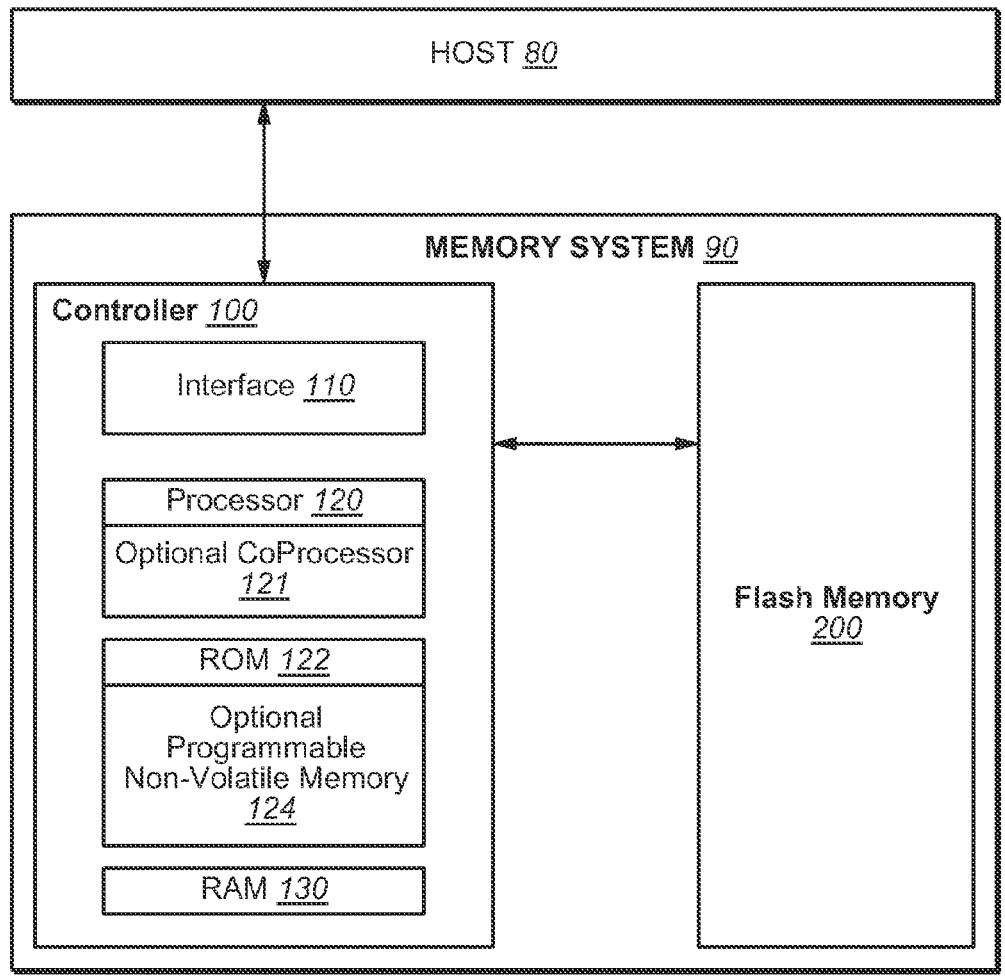
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card, solid state drive (SSD), or an embedded memory system. The memory system 90 includes a memory 200 whose operations are controlled by a controller 100. The memory 200 comprises of one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Physical Memory Structure

With respect to the memory section 200, memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

Associated circuitry is typically required for proper operation of the memory elements and for proper communication with the memory elements. This associated circuitry may be on the same substrate as the memory array and/or on a separate substrate. As non-limiting examples, the memory devices may have driver circuitry and control circuitry used in the programming and reading of the memory elements.

One of skill in the art will recognize that this invention is not limited to the two dimensional and three dimensional exemplary structures described but cover all relevant memory structures within the spirit and scope of the invention as described herein and as understood by one of skill in the art.

Figure 2:
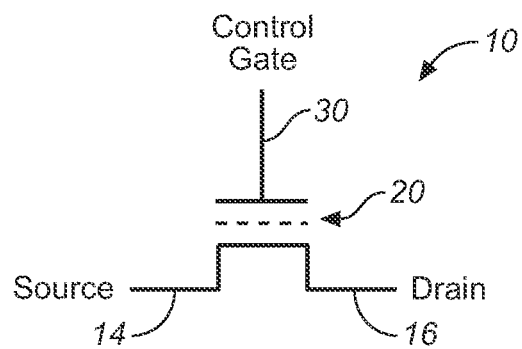
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
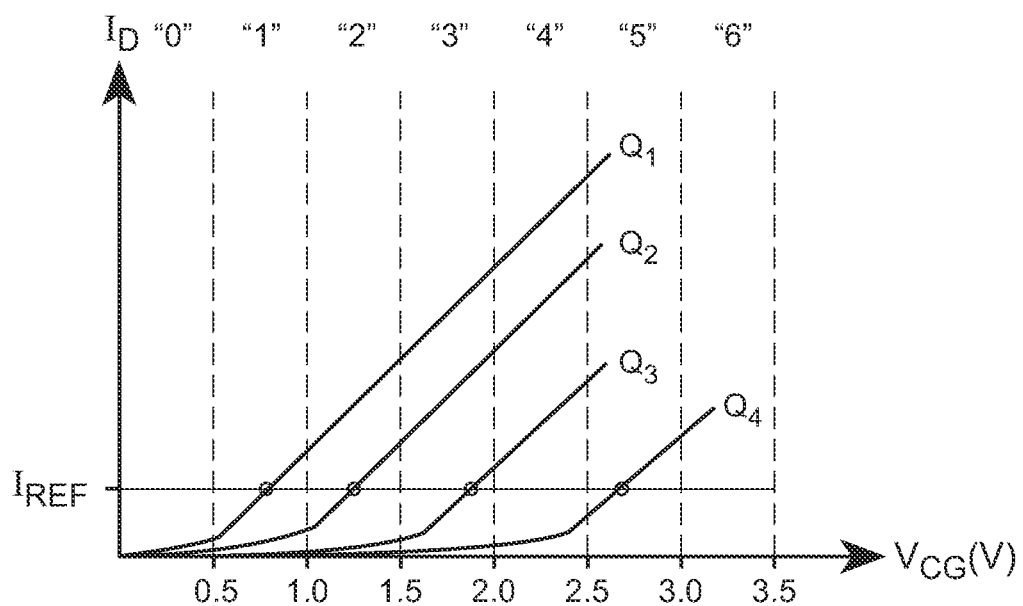
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CC}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "1" since its curve intersects with $I_{REF}$ in the region of the threshold window demarcated by. VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
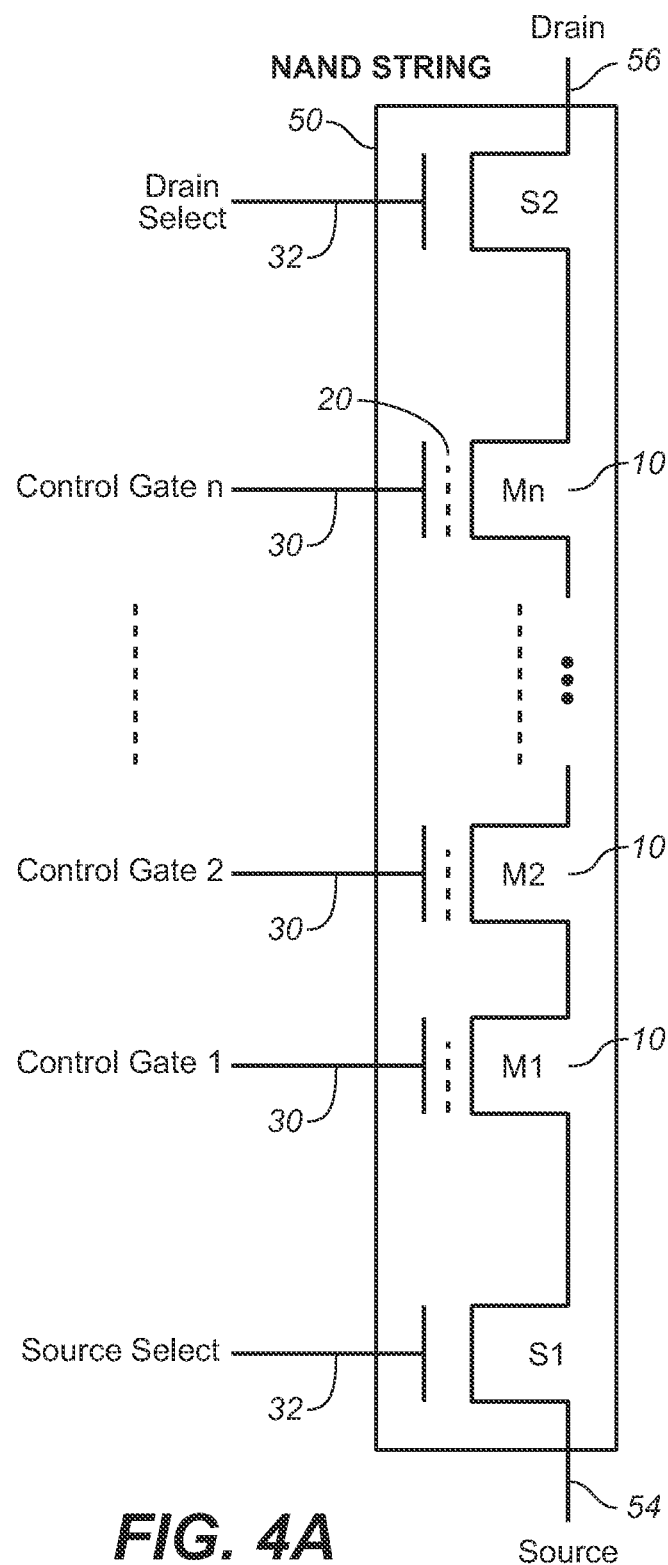
FIG. 4A illustrates schematically a string of memory cells organized into an NAND string.

FIG. 4A illustrates schematically a string of memory cells organized into an NAND string. An NAND string 50 comprises of a series of memory transistors M1, M2, ... Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
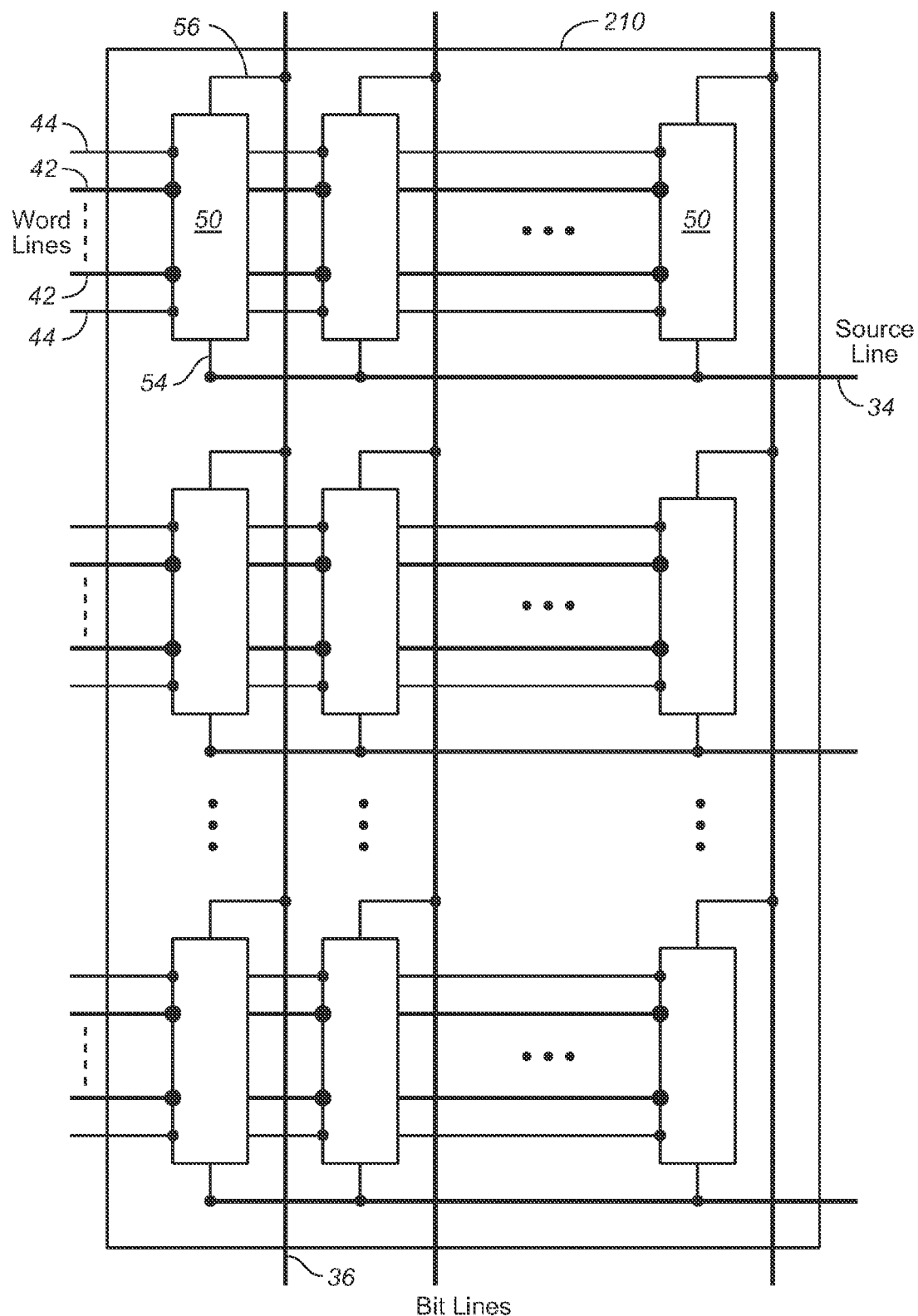
FIG. 4B illustrates an example of an NAND array 210 of memory cells, constituted from NAND strings 50 such as that shown in FIG. 4A.

FIG. 4B illustrates an example of an NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Figure 5:
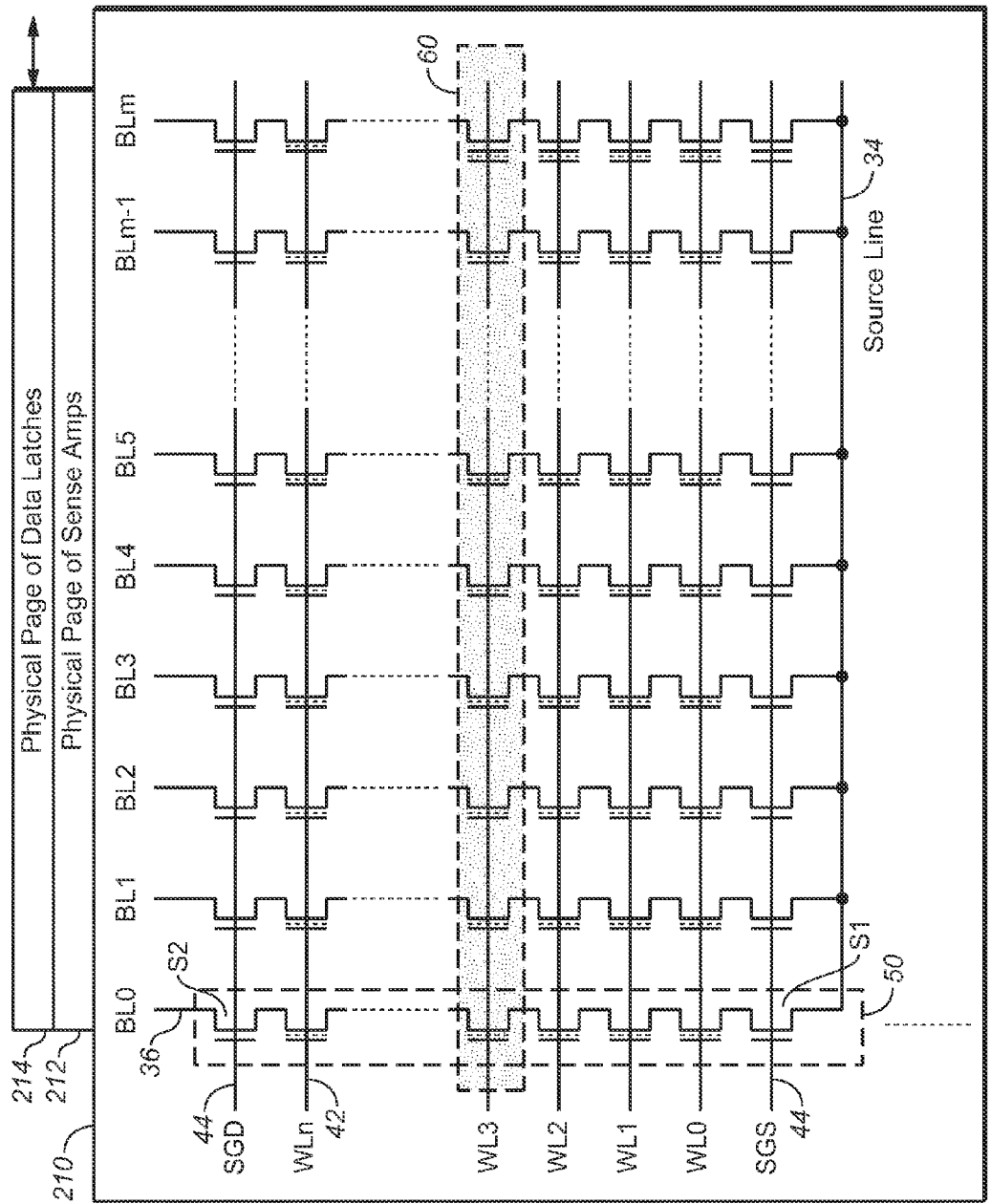
FIG. 5 illustrates a page of memory cells, organized for example in the NAND configuration, being sensed or programmed in parallel.

FIG. 5 illustrates a page of memory cells, organized for example in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A "page" such as the page 60, is a group of memory cells enabled to be sensed or programmed in parallel. This is accomplished by a corresponding page of sense amplifiers 212. The sensed results are latches in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and of type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data. Just before the block is erased, a garbage collection is required to salvage the non-obsolete data in the block.

Each block is typically divided into a number of pages. A page is a unit of programming or reading. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Multiple blocks and pages distributed across multiple arrays can also be operated together as metablocks and metapages. If they are distributed over multiple chips, they can be operated together as megablocks and megapage.

Examples of Multi-level Cell ("MLC") Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

All-bit, Full-Sequence MLC Programming

Figure 6:
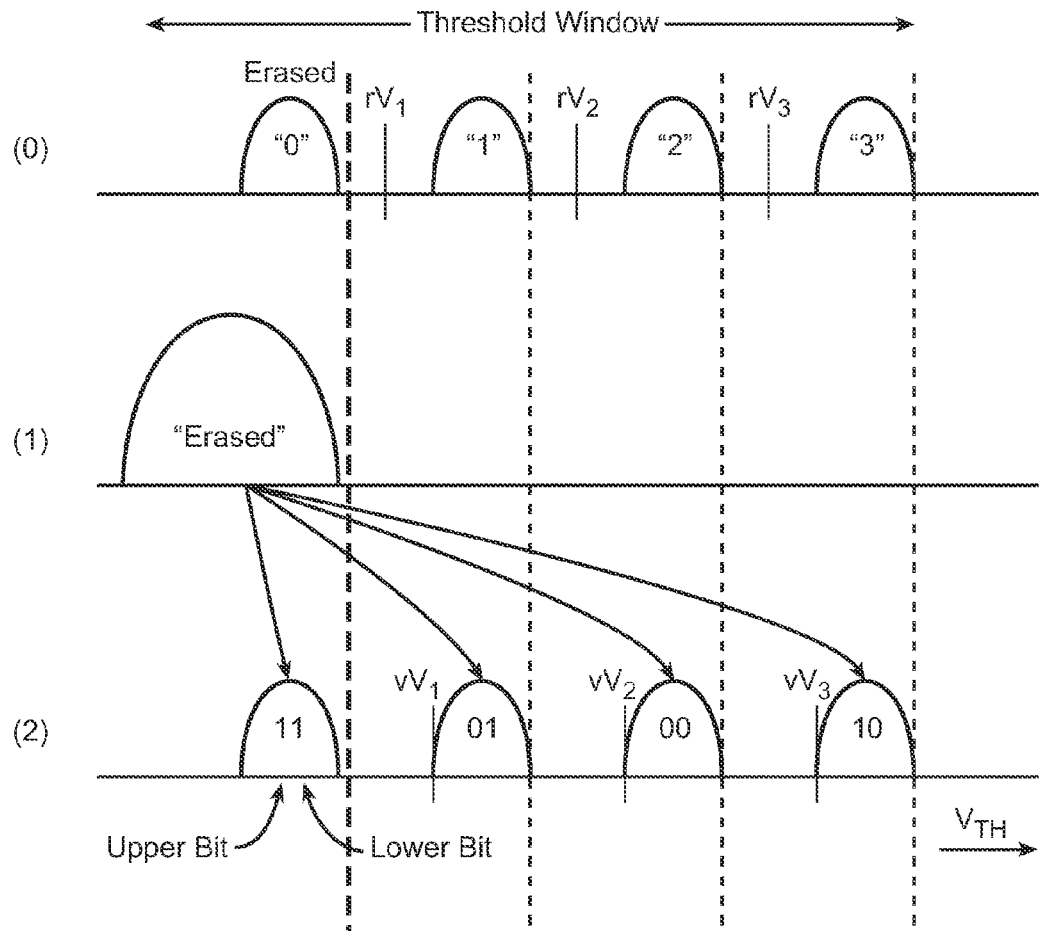
FIGS. 6(0)-6(2) illustrate an example of programming a population of 4-state memory cells.

FIGS. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed state "1", "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
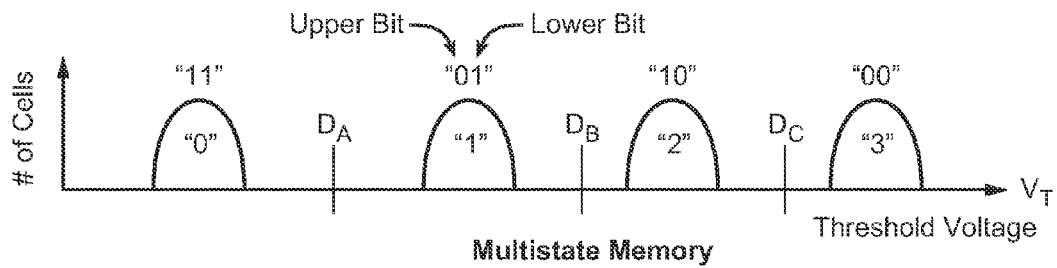
FIGS. 7A-7E illustrate the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. patent application Ser. No. 10/830,824 filed Apr. 24, 2004 by Li et al., entitled "NON-VOLATILE MEMORY AND CONTROL WITH IMPROVED PARTIAL PAGE PROGRAM CAPABILITY".

Figure 7B:
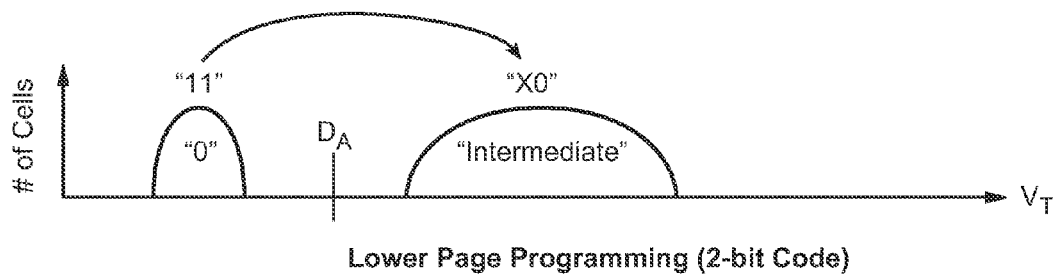

FIG. 7B illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than D.

Figure 7C:
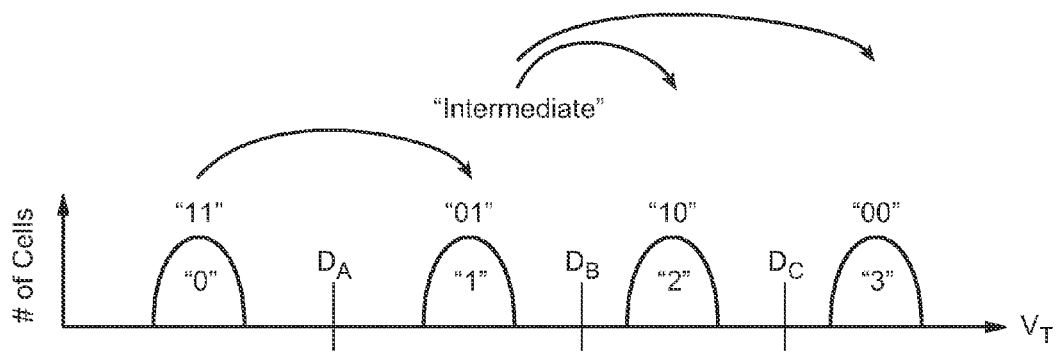

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7D:
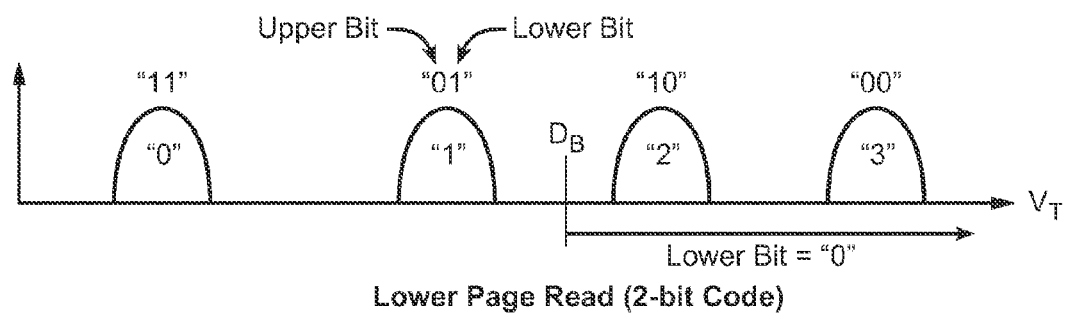

FIG. 7D illustrates the read operation that is required to discern the lower bit of the 4-state memory encoded with the 2-bit code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 7E:
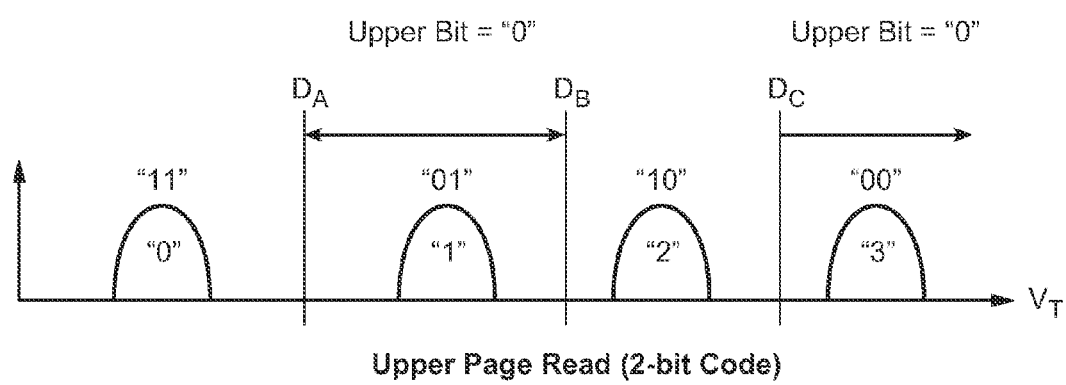

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit.

Foggy-Fine Programming

Figure 7F:
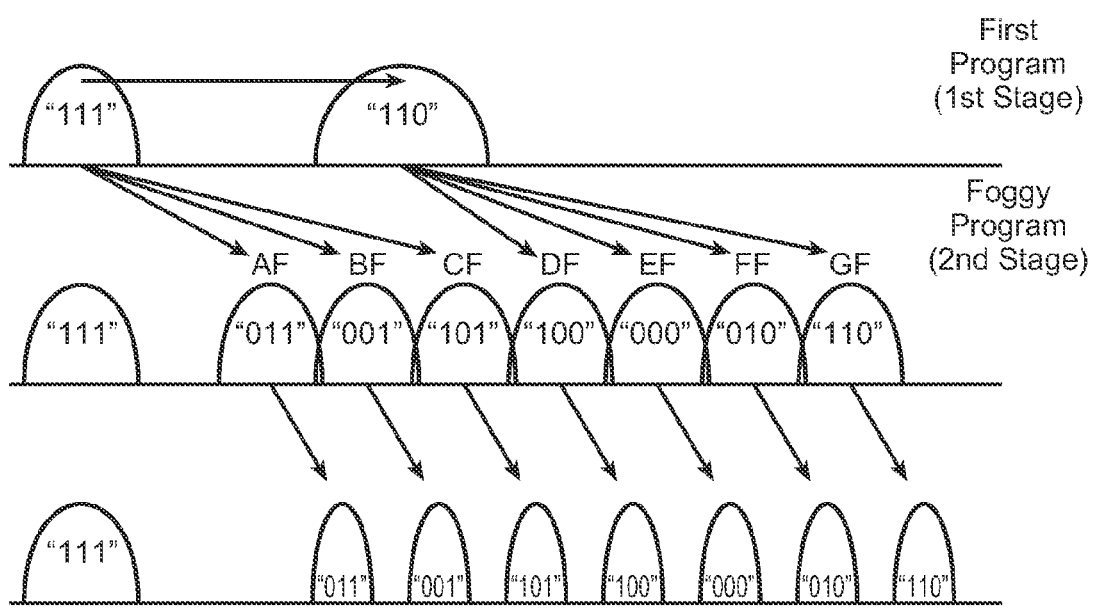
FIG. 7F illustrates a foggy-fine programming for an 8-state memory encoded with a given 3-bit code.

Another variation on multi-state programming employs a foggy-fine algorithm, as is illustrated in FIG. 7F for a 3-bit memory example. As shown there, this another multi-phase programming operation. A first programming operation is performed as shown in the top line, followed the foggy programming stage. The foggy phase is a full 3-bit programming operation from the first phase using all eight of the final states. At the end of the foggy, though, the data in these states is not yet fully resolved into well-defined distributions for each of the 8 states (hence, the "foggy" name) and is not readily extractable.

As each cell is, however, programmed to near its eventual target state, the sort of neighboring cell to cell couplings, or "Yupin" effect, described in U.S. Pat. No. 6,870,768 are presenting most of their effect. Because of this, when the fine program phase (shown on the bottom line) is executed, these couplings have largely been factored in to this final phase so the cell distributions are more accurately resolved to their target ranges. More detail on these subjects is given in U.S. Pat. Nos. 6,870,768 and 6,657,891 and in the US patent application entitled "Atomic Program Sequence and Write Abort Detection" by Gorobets et al. having attorney application Ser. No. 12/642,740, which was filed Dec. 18, 2009, and which presents a "diagonal" first-foggy-fine method.

Binary and MLC Memory Partitioning

FIG. 6 and FIG. 7 illustrate examples of a 2-bit (also referred to as "D2") memory. As can be seen, a D2 memory has its threshold range or window partitioned into 4 regions, designating 4 states. Similarly, in D3, each cell stores 3 bits (low, middle and upper bits) and there are 8 regions. In D4, there are 4 bits and 16 regions, etc. As the memory's finite threshold window is partitioned into more regions, the resolution and for programming and reading will necessarily become finer. Two issues arise as the memory cell is configured to store more bits.

First, programming or reading will be slower when the threshold of a cell must be more accurately programmed or read. In fact in practice the sensing time (needed in programming and reading) tends to increase as the square of the number of partitioning levels.

Secondly, flash memory has an endurance problem as it ages with use. When a cell is repeatedly programmed and erased, charges is shuttled in and out of the floating gate 20 (see FIG. 2) by tunneling across a dielectric. Each time some charges may become trapped in the dielectric and will modify the threshold of the cell. In fact over use, the threshold window will progressively narrow. Thus, MLC memory generally is designed with tradeoffs between capacity, performance and reliability.

Conversely, it will be seen for a binary memory, the memory's threshold window is only partitioned into two regions. This will allow a maximum margin of errors. Thus, binary partitioning while diminished in storage capacity will provide maximum performance and reliability.

The multi-pass, bit-by-bit programming and reading technique described in connection with FIG. 7 provides a smooth transition between MLC and binary partitioning. In this case, if the memory is programmed with only the lower bit, it is effectively a binary partitioned memory. While this approach does not fully optimize the range of the threshold window as in the case of a single-level cell ("SLC") memory, it has the advantage of using the same demarcation or sensing level as in the operations of the lower bit of the MLC memory. As will be described later, this approach allows a MLC memory to be "expropriated" for use as a binary memory, or vice versa. How it should be understood that MLC memory tends to have more stringent specification for usage.

Binary Memory and Partial Page Programming

The charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

The Bit-by-Bit MLC Programming technique described in connection with FIG. 7 above is designed to minimize program disturb from cells along the same word line. As can be seen from FIG. 7B, in a first of the two programming passes, the thresholds of the cells are moved at most half way up the threshold window. The effect of the first pass is overtaken by the final pass. In the final pass, the thresholds are only moved a quarter of the way. In other words, for D2, the charge difference among neighboring cells is limited to a quarter of its maximum. For D3, with three passes, the final pass will limit the charge difference to one-eighth of its maximum.

However, the bit-by-bit multi-pass programming technique will be compromised by partial-page programming. A page is a group of memory cells, typically along a row or word line, that is programmed together as a unit. It is possible to program non overlapping portions of a page individually over multiple programming passes. However, owning to not all the cells of the page are programmed in a final pass together, it could create large difference in charges programmed among the cells after the page is done. Thus partial-page programming would result in more program disturb and would require a larger margin for sensing accuracy.

In the case the memory is configured as binary memory, the margin of operation is wider than that of MLC. In the preferred embodiment, the binary memory is configured to support partial-page programming in which non-overlapping portions of a page may be programmed individually in one of the multiple programming passes on the page. The programming and reading performance can be improved by operating with a page of large size. However, when the page size is much larger than the host's unit of write (typically a 512-byte sector), its usage will be inefficient. Operating with finer granularity than a page allows more efficient usage of such a page.

The example given has been between binary versus MLC. It should be understood that in general the same principles apply between a first memory with a first number of levels and a second memory with a second number of levels more than the first memory.

Logical and Physical Block Structures

Figure 8:
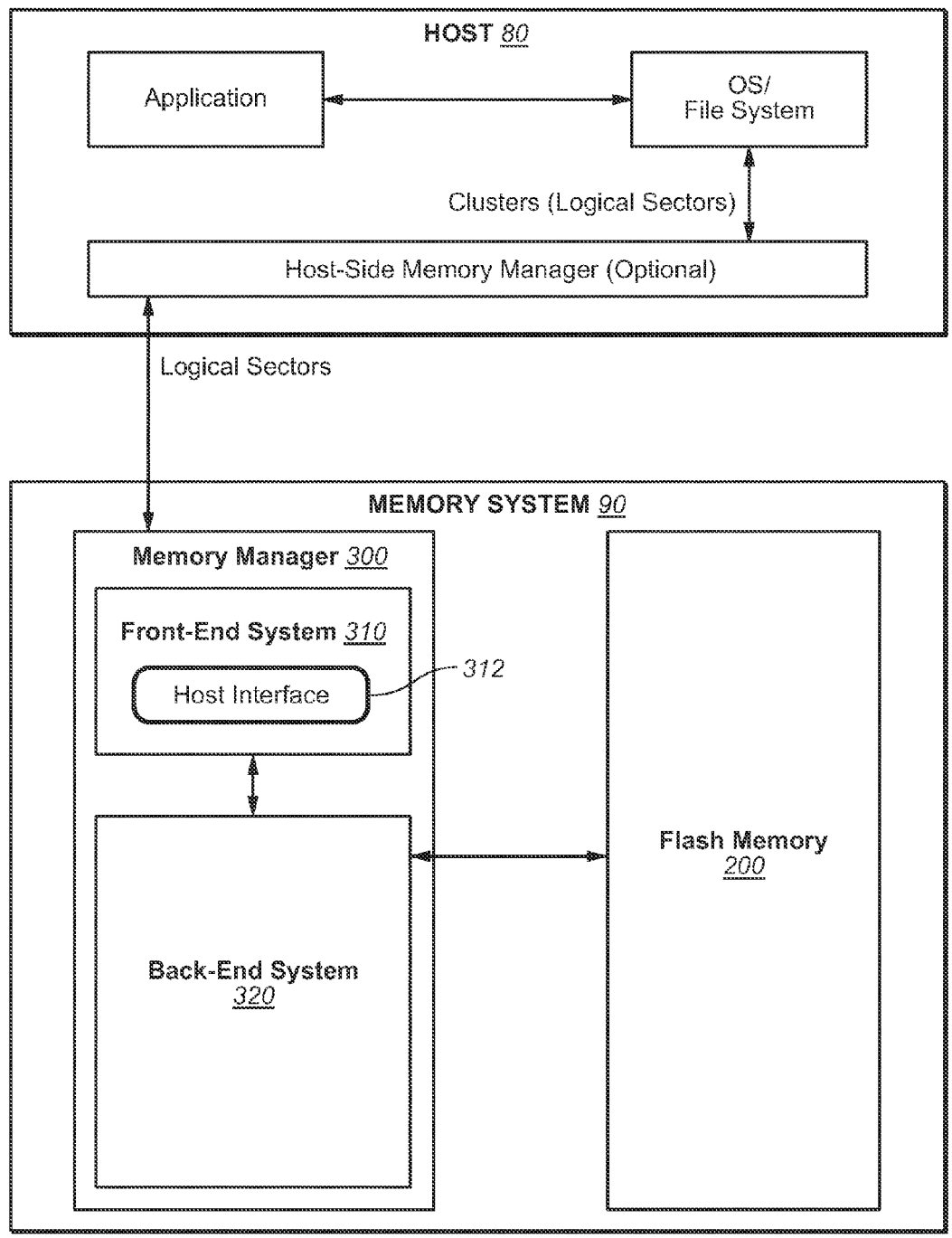
FIG. 8 illustrates the memory being managed by a memory manager with is a software component that resides in the controller.

FIG. 8 illustrates the memory being managed by a memory manager with is a software component that resides in the controller. The memory 200 is organized into blocks, each block of cells being a minimum unit of erase. Depending on implementation, the memory system may operate with even large units of erase formed by an aggregate of blocks into "metablocks" and also "megablocks". For convenience the description will refer to a unit of erase as a metablock although it will be understood that some systems operate with even larger unit of erase such as a "megablock" formed by an aggregate of metablocks.

The host 80 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 80 essentially issues a command to the memory system 90 to read or write a segment containing a string of logical sectors of data with contiguous addresses.

A memory-side memory manager 300 is implemented in the controller 100 of the memory system 90 to manage the storage and retrieval of the data of host logical sectors among metablocks of the flash memory 200. The memory manager comprises a front-end system 310 and a back-end system 320. The front-end system 310 includes a host interface 312. The back-end system 320 includes a number of software modules for managing erase, read and write operations of the metablocks. The memory manager also maintains system control data and directory data associated with its operations among the flash memory 200 and the controller RAM 130.

Figure 9:
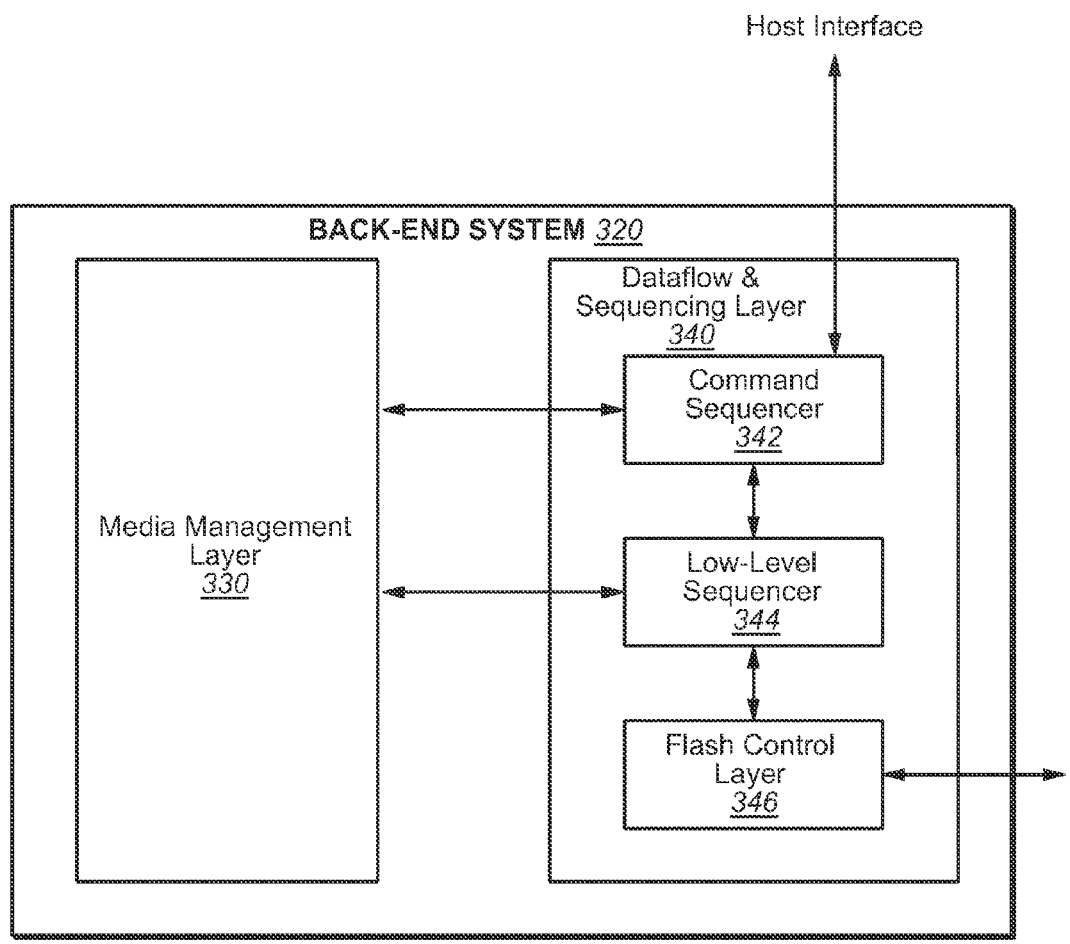
FIG. 9 illustrates the software modules of the back-end system.

FIG. 9 illustrates the software modules of the back-end system. The Back-End System mainly comprises two functional modules: a Media Management Layer 330 and a Dataflow and Sequencing Layer 340.

The media management layer 330 is responsible for the organization of logical data storage within a flash memory meta-block structure. More details will be provided later in the section on "Media management Layer".

The dataflow and sequencing layer 340 is responsible for the sequencing and transfer of sectors of data between a front-end system and a flash memory. This layer includes a command sequencer 342, a low-level sequencer 344 and a flash Control layer 346. More details will be provided later in the section on "Low Level System Spec".

The memory manager 300 is preferably implemented in the controller 100. It translates logical addresses received from the host into physical addresses within the memory array, where the data are actually stored, and then keeps track of these address translations.

Figure 10A:
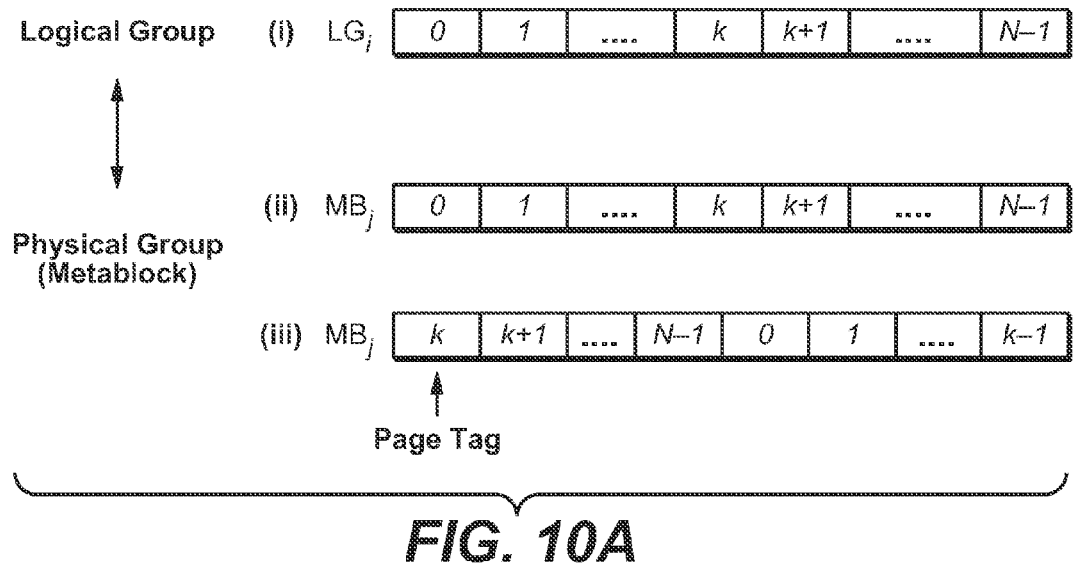
FIGS. 10A(i)-10A(iii) illustrate schematically the mapping between a logical group and a metablock.

FIGS. 10A(i)-10A(iii) illustrate schematically the mapping between a logical group and a metablock. The metablock of the physical memory has N physical sectors for storing N logical sectors of data of a logical group. FIG. 10A(i) shows the data from a logical group $LG_i$, where the logical sectors are in contiguous logical order 0, 1, . . . , N−1. FIG. 10A(ii) shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 10A(iii), the metablock stores in its first location beginning with the data of logical sector k. When the last logical sector N−1 is reached, it wraps around to sector 0 and finally storing data associated with logical sector k−1 in its last physical sector. In the preferred embodiment, a page tag is used to identify any offset, such as identifying the starting logical sector address of the data stored in the first physical sector of the metablock. Two blocks will be considered to have their logical sectors stored in similar order when they only differ by a page tag.

Figure 10B:
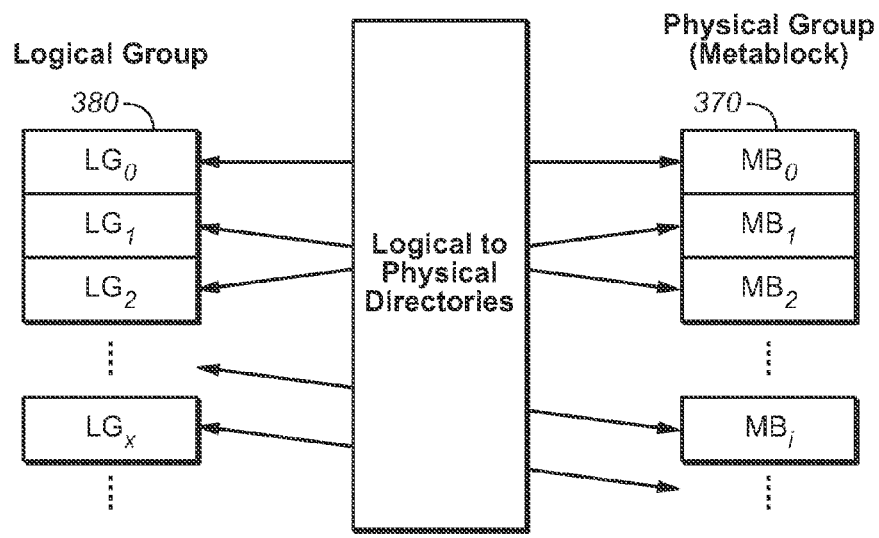
FIG. 10B illustrates schematically the mapping between logical groups and metablocks.

FIG. 10B illustrates schematically the mapping between logical groups and metablocks. Each logical group 380 is mapped to a unique metablock 370, except for a small number of logical groups in which data is currently being updated. After a logical group has been updated, it may be mapped to a different metablock. The mapping information is maintained in a set of logical to physical directories, which will be described in more detail later.

Finding Read Disturbs

Due to capacitive coupling between memory cells on adjacent word lines, voltage levels used while accessing data on one word line can affect data quality on the neighboring word line, non-accessed word. This can occur in both write operations, leading to "write disturbs", and in read operation, leading to "read disturbs". There are a number of techniques are known for dealing with program disturbs, including altering voltage ramp rates (see, for example, U.S. Pat. No. 6,717, 851), altering the order in which word lines are written (see, for example, U.S. Pat. No. 7,986,554), using foggy-fine algorithms (discussed above), or various post-write read verifications (see, for example, US patents and patent publication numbers U.S. Pat. No. 8,634,240 and 2013-0028021). This section considers techniques for determining word lines more likely to be suffering from a read disturbs, where reads to a localized zone of the memory can cause undetected disturbances in neighboring word lines within a block.

A number of approaches can be used to address this problem. One is to use block read counters in RAM on the controller, which can give a fair approximation when a block may become disturbed by reads. This solution consumes a pretty fair amount of memory space (at least 4 bytes per block times the number of blocks in the system). In an SSD with 256K blocks, this can equate to about a 1 MB of space to track simple read counters, which is a significant amount of relatively expensive controller RAM. Even when using this amount of RAM, a major problem with block counters is that they do not provide the granularity to know which word lines caused the problem and that the threshold is set extremely low. When the threshold for the block trips, the whole block is scrubbed (i.e. copied), which leads to premature cycling. With the scheme presented here, the system can detect specifically which word line was read, moves that data and neighbor data, but can leave the rest of the block intact.

Another approach is a read patrol (see US patents and patent publication numbers U.S. Pat. Nos. 7,012,835; 7,477,547; 7,616,484; and 2009/0172258), either randomly or serially sampling written blocks with valid data to look for read disturbs. This method uses extra background power and may not find hot zones in time (as this is dependent upon the amount of background time) or at all. The read patrol takes a significant amount of time to get coverage of the full device. Also, the read patrol itself contributes to the read disturb, the problem it is trying to solve. Reading neighboring word lines periodically for host reads can help to detect potential read disturbs, but adds additional power and latency to host operations. Additionally, reading neighbor word lines is subject to noise error and becomes cumber in trying to detect and identify hot read data addresses.

The exemplary embodiments presented here use a hash tree to track read zones and find hot read areas of the flash. The hash tree uses a small footprint of memory area and can provide more accuracy than a simple block counter, depending on the tree's design level. The hash tree can help isolate regions of the flash that the host is reading. Depending on the embodiment, the tree can be designed to be tall or short, with more branches or more singular, the tree can be symmetric or asymmetrical.

Initially, when the tree starts, only one level is used, level 0. Level 0 can be a single set of N 4-byte counters. As a zone is hit by reads, the read counter is incremented. When the zone reaches a certain threshold, the zone is elevated to level 1. When the zone is elevated to level 1, its space is broken into further zones in level 1. This provides more accuracy for detecting the hot space of a zone. A pointer can be used to indicate which zones have been elevated. After a zone is elevated, its root can still increment to help keep track of its read count. The threshold to elevate can be modified as the tree fills up.

The elevation of the zones can continue up the tree, where each level hash can have one or more children nodes. Because space is limited in an embedded device, when a different zone in a lower node becomes hotter, an eviction should take place at some point so that the tree cannot grow without bounds. When an eviction happens, the zone is collapsed down and a new zone is elevated in the tree for more analysis. During an eviction the zone read count is still preserved, but the tree information is lost.

The number of levels will depend on the implementation. As zones reach the tree tips, and reaches the highest threshold, the zone can placed on a read patrol list for further evaluation for read scrub. More detail on scrub, refresh, and patrol operations can be found in US patents and patent publication numbers U.S. Pat. Nos. 7,012,835; 7,477,547; 7,616,484; and 2009/0172258.

To maintain the tree structure and level counts, periodically the tree and its parameters can be saved to the non-volatile memory on the memory section. Then on power up the table can be loaded from the non-volatile memory back to controller RAM.

To avoid counter saturation, the tree can be pruned back by some amount periodically. The pruning will occur with block erases, hot read data migration, and, alternatively, when certain hot count (number of erases) milestones are reached. This process can be referred to as a "tree leveling", where when the program/erase counter reaches a certain level, the whole tree can be pared back. If the device is evenly wear leveled, then all the blocks in the system shall vary in hot count by no more than percentage variation. (More detail on where leveling is given in US patents and patent publication numbers U.S. Pat. Nos. 7,353,325; 7,441,067; 7,120,729; and 2010-0174845.) Using this knowledge, certain hot count checkpoints can be established to prune down the tree. The pruning of the tree can be a global reset, or pairing the counters by a percentage, or pairing the tree by a fixed amount. The tree can be pruned whenever the stem threshold is crossed (causing a block, word line, logical group, or other structure corresponding to that level's zone to reach the scrub list).

When an area is detected hot, the hot area (and its neighboring word lines) can either be refreshed to a new block (leaving the rest of the block intact), or the whole block can be scrubbed. The hot data can either be refreshed to a separate zone, so as to not trip the tree up as the reads continue, or it can just migrate naturally. If migrating naturally then nothing special needs to be done in the event that a hot read zone becomes cold. The separate zone for hot data can be managed in various ways to reduce the resultant amount read disturbs. For example, the data can be stored in binary format, use different margins, be stored with one or more unused word lines between the word lines storing data, and so on. For any of these arrangements, the detection of potential read disturbs can lead to the eviction of a partial block of data, including the immediate neighbor word lines, or recycling of the entire block with possible special handling of the hot read data. If the hot read data cools later, it can rejoin the regular pool.

In one set of embodiments, after a zone is detected hot, and the neighbors are checked and scrubbed, the hot data can be tracked logically using a separate table. Tracking this data separately can provide the advantage of detecting when the data becomes cold, and can help from having the same data trigger branching in the tree after scrubbing. The hot data would still need to be tracked for future read disturbs.

If the tree is used to track the device physically and an erase occurs within a zone, the read counters can be rolled back by a defined algorithm amount to account for the fact that a portion of that zone has been refreshed. Depending on the embodiment and the level, a branch of the tree can represent a logical group (4 KB, for example), a die's WL, a series of WLs, or a series of blocks. As erases occur on units of blocks, the branch that represents that block would need to collapse down to the block level if necessary. At the time of collapse, a new branch can be elevated or the elevation can occur on the next read to that set.

As read disturbs are the result of operations on physically adjacent word lines, the exemplary embodiments are based on tracking physical addresses of the zones at each level. An alternative embodiment is to have the tree track the addresses logically instead of physically, with any writes to a zone/branch should have a decrementing effect on the counters.

Figure 11:
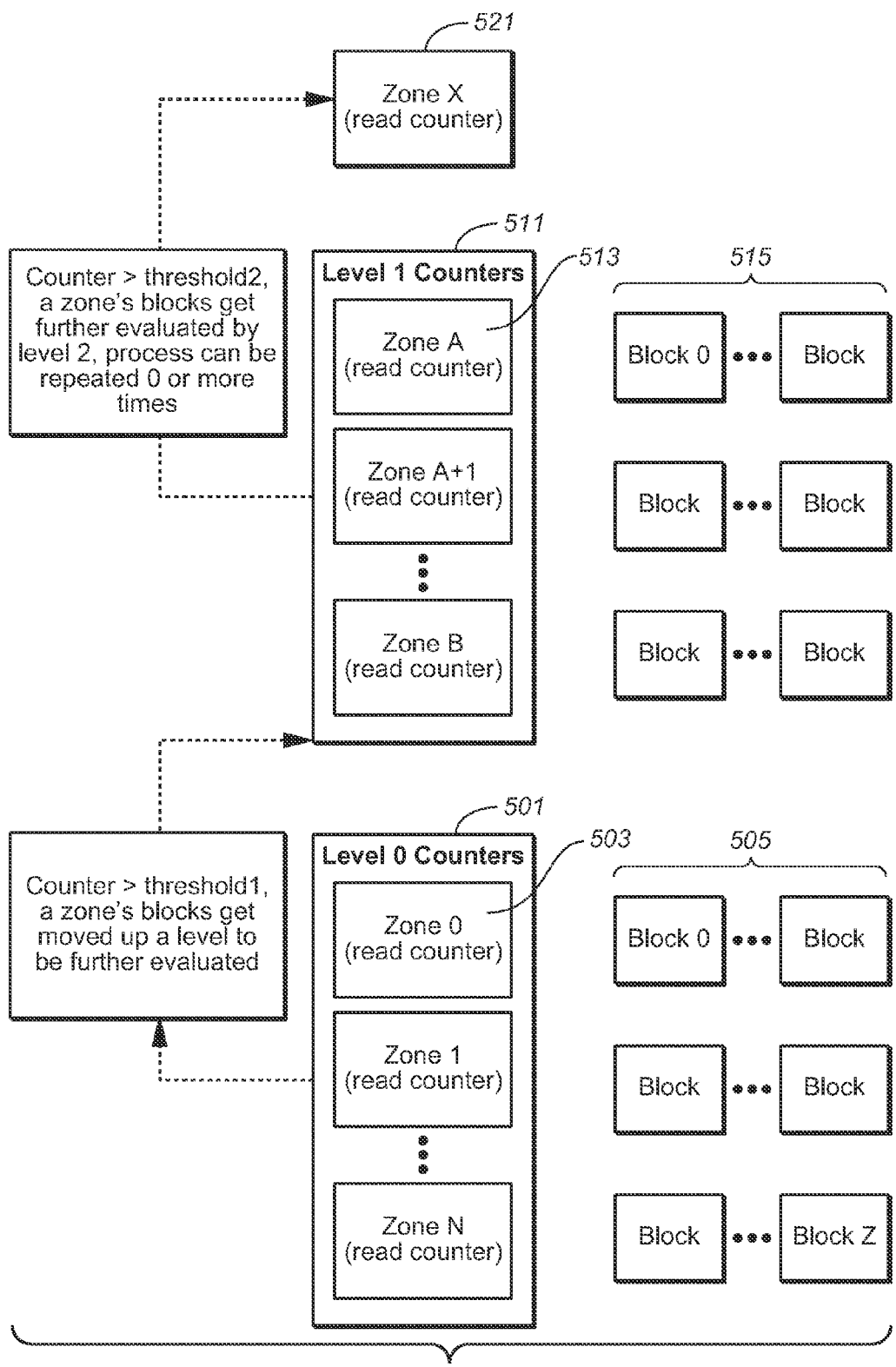
FIG. 11 is a schematic representation of the process for a two level example.
Figure 12:
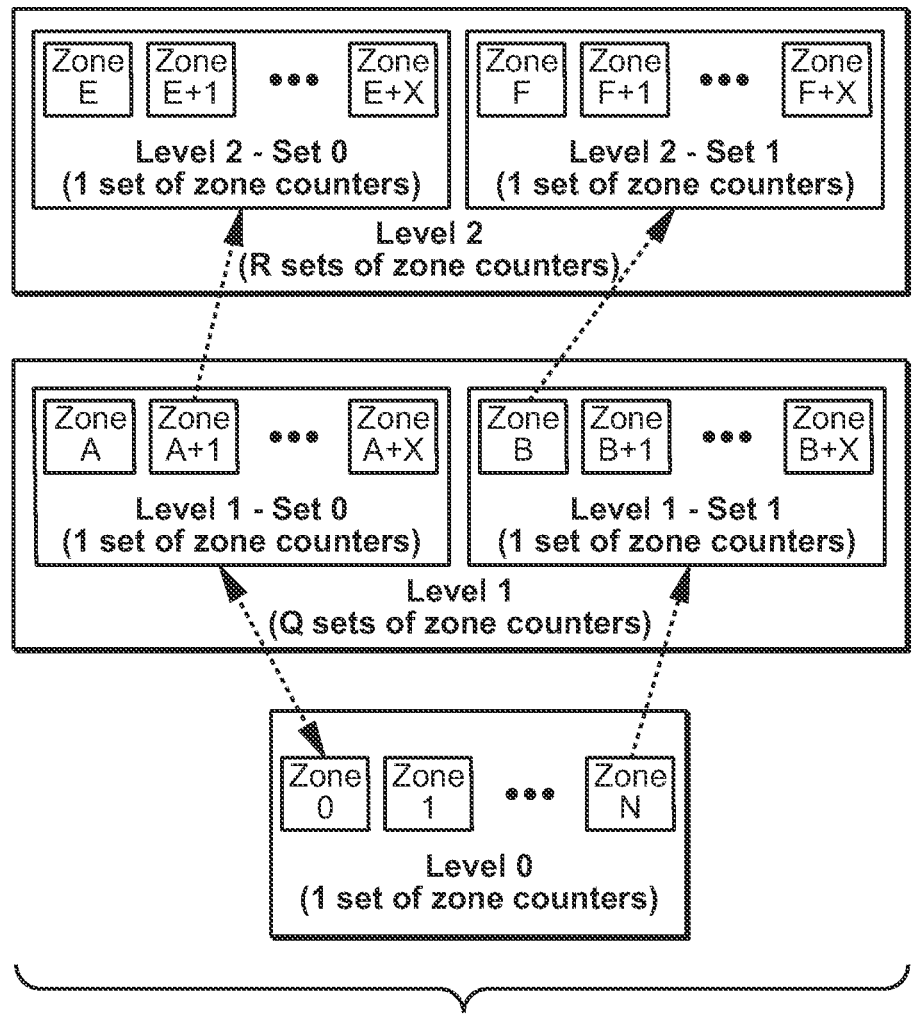
FIGS. 12 and 13 provide further illustration of a hash tree to track read zones.
Figure 13:
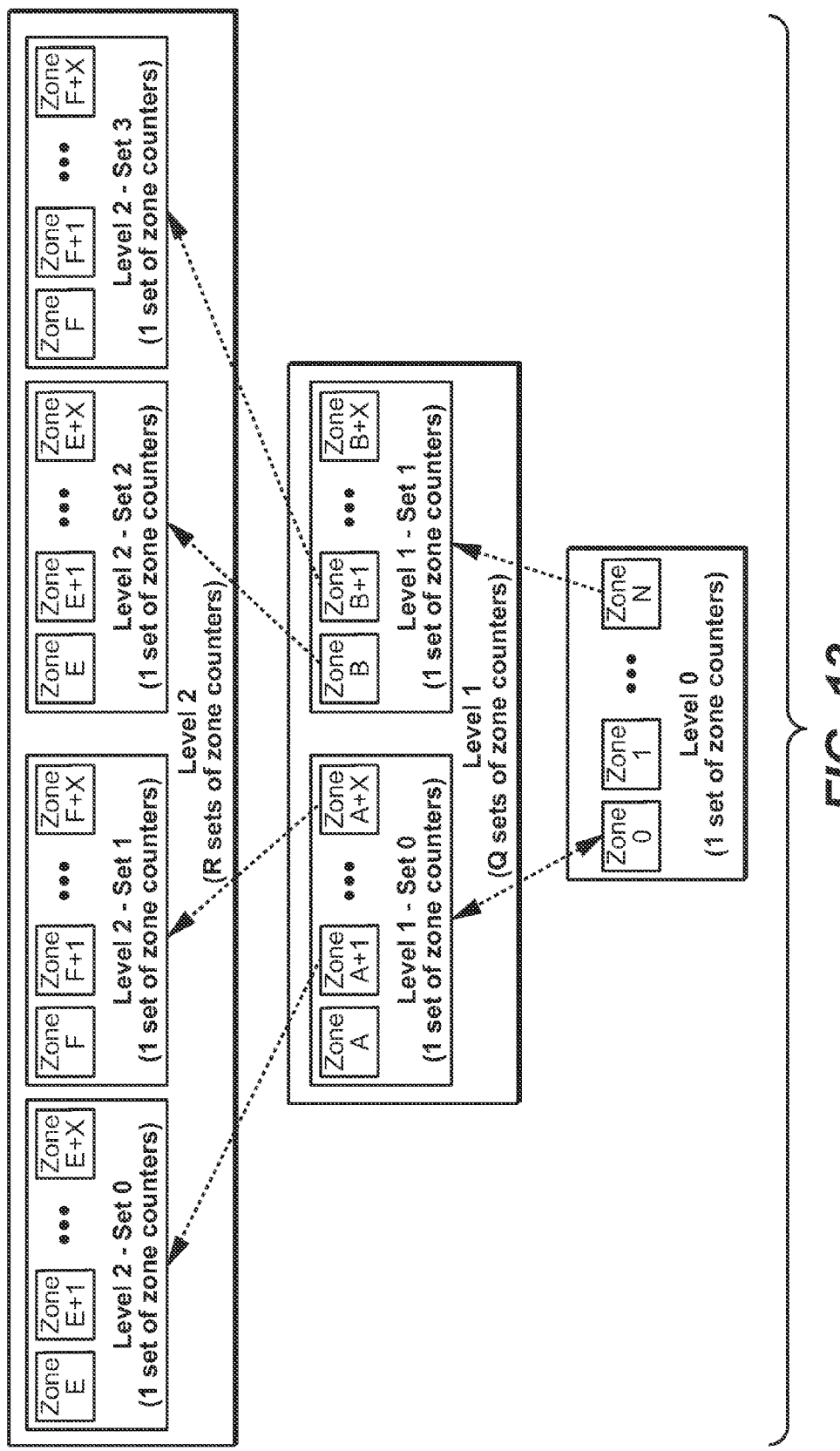

Some of these concepts are illustrated with respect FIGS. 11-13. FIG. 11 is a schematic representation of the process for a two level example. Generally, level 0 zones can be die, portion of a die, number of blocks, and so on down to a group of word lines. The zones at the highest level (level 1 in this example) can be as small as individual word lines. (In this discussion, "zone" is not meant, or at least not necessarily meant, to correspond to the sort of zone structure described in U.S. Pat. No. 6,901,498, for example, but is being used more generally for physical memory regions such as die, block, word line and soon.) In the example of FIG. 11 the level 0 zone is taken as some number of blocks and the level 1 zone is taken as some fraction of the blocks of the level 0 zone.

At lower part of FIG. 11 are the level 0 counters 501, each of the read counters corresponding to one or zones 0 to N. For example, counter 503 tracks the number of times the blocks 505 of zone 0 are accessed for a read. In this example, Zone 0's blocks are split into level 1 zones for further analysis, there can be several level 1 counters. As shown to the left, when a counter reaches a threshold for the level the corresponding zone's block are moved up a level for further evaluation. When a zone moves up in levels, the count can either be evenly distributed to its subparts, reset to 0, or a separate master zone counter maintained.

At level 1, the elevated level 0 zone is sub-divided into a set of level 1 zones with corresponding counters 511: for example, Zone A of blocks 515 is monitored using counter 513. The counters of level 1 are checked against the level's threshold and moved up as needed to the level or on a list for read scan, where, depending on the implementation, the system can repeat the narrowing process to get down to a group of blocks, a group of WLs, or even to the smallest read/write granularity as based on the system's ECC unit (referred to variously as a flash management unit, FMU, a codeword, or ECC page). When a block is erased, and the block is at a higher level (such as level 1 in FIG. 11), the zone can be shifted down a level. The collapsing of elements can be based on the comparison of other counters, block erasures, or as part of a tree levelling procedure. A collapsing of one branch can cause division in another branch. The root nodes can be evaluated on a tree collapse, or if no free zone counters are available, then the whole tree could be re-evaluated on any collapse, where priority can be given to the zone with the highest counter or the most recent counter.

From level 1, a zone Zone X with counter 521 is moved to the candidate list for read scan to check for rad disturb effects. If this zone is narrowed down to a word line or series of word lines, these can be placed on a "burning zone" list for frequently accessed zones.

FIG. 12 looks the situation in more detail. At bottom is the set of zone counters for Level 0, where Zones 0-N can represent the entire plane, die, chip, or device capacity. Based on the count values, as these reach the corresponding thresholds the counters of the set can be partitioned into equal sized zones for level 1. FIG. 12 shows the case when Q zones (two of which are shown) from level 0 have been elevated to level 1, each subdivided into X zones with a corresponding counter. For example, Zone 0 from level 0 is here broken into multiple smaller zones Zone A to Zone A+X at level 1. The counters for the zones of level 1 are similarly used to determine when to move a zone of level 1 to level. For example, Zone A+1 is here broken into multiple (X again in this example) smaller zones in level 2. If, say, Zone 'E+1' then has a high count value, it can then be sent to the read scan to check for read disturb effects.

FIG. 13 is similar to FIG. 12, but for a slightly different scenario. FIG. 13 shows two of the level 0 zones (zones 0 and N) each subdivided into a set of level 1 zones, each of which then has two zones (zones A+1 and A+X, zones B and B+1) further split into sets of level 2 zones. A symmetrical hash tree may be easier for firmware/hardware to maintain, although asymmetrical trees can be used as well.

For any of the embodiments, the techniques of this section can help to determine locations of possible read disturbs with fewer reads to the device and less use of power. Hot read zones can be found accurately with a smaller memory footprint than in other counter solutions. This can help to avoid un-necessary scrubbing of data and blind background patrolling.

Conclusion

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a non-volatile memory system having one or more memory circuits and a controller circuit, the memory circuits each including one or more arrays of non-volatile memory cells formed along word lines and the controller circuit managing the storage of data on the memory circuit, the method comprising:
   for each of a first plurality of distinct divisions of the one or more memory arrays maintaining by the controller circuit a count of the number of times word lines of the corresponding division are accessed for a read operation;
   in response to one of the counts for a corresponding division reaching a first threshold value, subdividing the corresponding division into a second plurality of distinct first subdivisions; and
   subsequently maintaining by the controller circuit for each of the first subdivisions a count of the number of times word lines of the subdivision are accessed for read operations.

2. The method of claim 1, further comprising:
   in response to one of the counts for a corresponding subdivision reaching a second threshold value, further subdividing the corresponding subdivision into a third plurality of distinct first sub-subdivisions; and
   subsequently maintaining by the controller circuit for each of the first sub-subdivisions a count of the number of times word lines of the sub-subdivision are accessed for read operations.

3. The method of claim 1, wherein the first plurality of distinct divisions were previously formed by subdividing one of a plurality of structures formed of such divisions in response to a number of accesses for read operations.

4. The method of claim 1, further comprising:
   in response to one of the counts for a corresponding subdivision reaching a second threshold value, placing the corresponding one of the subdivisions a list of subdivisions on which to perform a data scrub operation.

5. The method of claim 1, further comprising:
in response to one of the counts for a corresponding subdivision reaching a second threshold value, performing a scrub operation on the corresponding one of the subdivisions.

6. The method of claim 1, further comprising:
in response to one of the counts for a corresponding subdivision reaching a second threshold value, relocating the data from the corresponding one of the subdivisions to a different location on the memory circuits.

7. The method of claim 6, wherein the different location on the memory circuits is reserved by the controller circuit for frequently accessed data.

8. The method of claim 7, wherein the location reserved by the controller circuit for frequently accessed data is managed differently by the controller circuit than other portions of the memory circuits.

9. The method of claim 8, wherein data is stored in a binary format in the location reserved for frequently accessed data.

10. The method of claim 8, wherein data is stored on non-adjacent word lines in the location reserved for frequently accessed data.

11. The method of claim 7, wherein the relocated data is subsequently evicted from the location reserved for frequently accessed data in response to determining that the frequency of being accessed for the relocated data is decreased.

12. The method of claim 6, wherein the data relocated includes one or more frequently accessed word lines and one or more word lines adjacent the frequently accessed word lines.

13. The method of claim 6, wherein the relocating the data from the corresponding one of the subdivisions includes the relocation of an entire erase block.

14. The method of claim 1, wherein the controller circuit includes a volatile memory in which are maintained the values of the counts.

15. The method of claim 14, wherein the controller circuit periodically saves the count values to non-volatile memory on the memory circuits.

16. The method of claim 15, wherein on power up, the controller circuit loads the count values saved in non-volatile memory into the volatile memory on the controller circuit.

17. The method of claim 1, wherein the memory circuits are flash memory circuit and the divisions correspond to a plurality of erase blocks.

18. The method of claim 1, wherein the memory circuits are flash memory circuit and the subdivisions correspond to a plurality of erase blocks.

19. The method of claim 1, wherein the memory circuits are flash memory circuit and the divisions correspond to an erase blocks.

20. The method of claim 1, further comprising:
subsequently discontinuing of the maintaining by the controller circuit for one or more of the first subdivisions the count of the number of times word lines of the subdivision are accessed for read operations.

21. The method of claim 20, wherein the discontinuing is in response to the value of the counts being discontinued relative to others of the counts of the first subdivision.

22. The method of claim 20, wherein the discontinuing is in response to the corresponding division being erased.

23. The method of claim 20, wherein the discontinuing is in response to the number of counts being maintained.

24. The method of claim 1, wherein the memory circuits are flash memory circuit and the subdivisions correspond to an erase blocks.

25. The method of claim 1, wherein the divisions correspond to a set of word lines.

26. The method of claim 1, wherein the subdivisions correspond to a set of word lines.

27. The method of claim 1, wherein the memory circuits include a plurality of dies and the divisions correspond to a die.

28. The method of claim 1, wherein the arrays are of a NAND-type of architecture.

29. The memory of claim 1, wherein the arrays are of an architecture having a three dimensional memory array that is monolithically formed as a plurality of physical levels of memory cells, a physical level having an active layer disposed above a silicon substrate, the memory cells in communication with operating circuitry.

* * * * *